United States Patent [19]
Aalmers et al.

[11] Patent Number: 5,764,468
[45] Date of Patent: Jun. 9, 1998

[54] CIRCUIT COMPRISING A BUS CONDUCTOR AND A BUS INTERFACE CIRCUIT

[75] Inventors: Mathijs A. H. Aalmers; Marinus A. W. Van Den Broek, both of Nijmegen, Netherlands

[73] Assignee: U.S. Philips Corporation, New York, N.Y.

[21] Appl. No.: 758,654

[22] Filed: Dec. 2, 1996

[30] Foreign Application Priority Data

Dec. 1, 1995 [EP] European Pat. Off. ............. 95203314

[51] Int. Cl.⁶ ............................................ H02H 3/22
[52] U.S. Cl. ..................................... 361/91; 361/111
[58] Field of Search ........................... 361/56, 91, 111, 361/88; 326/21, 33, 34; 327/68

[56] References Cited

U.S. PATENT DOCUMENTS

| | | |
|---|---|---|
| 3,916,262 | 10/1975 | Easter. |
| 5,019,720 | 5/1991 | Skoog et al.. |
| 5,387,826 | 2/1995 | Shay et al.. |
| 5,406,140 | 4/1995 | Wert et al. .................. 328/68 |
| 5,450,025 | 9/1995 | Shay. |

FOREIGN PATENT DOCUMENTS 9429961  12/1994  WIPO.

*Primary Examiner*—Jeffrey A. Gaffin
*Assistant Examiner*—Sally C. Medley
*Attorney, Agent, or Firm*—Brian J. Wieghaus

[57] ABSTRACT

Various circuit components can communicate via a bus conductor. One circuit component comprises an interface stage with a transistor coupled between the bus conductor and a power supply terminal. When a further circuit component pulls the potential on the bus conductor beyond the potential of the power supply, the potential on the control electrode of the transistor is pulled along. The connection between the control electrode and the remainder of the circuit component is then turned off, irrespective of the state of the remainder of the circuit component. This remainder includes, for example, an inverter in antiparallel connection with an inverter formed in conjunction with the transistor, so that these inverters together constitute a bus-hold circuit.

11 Claims, 1 Drawing Sheet

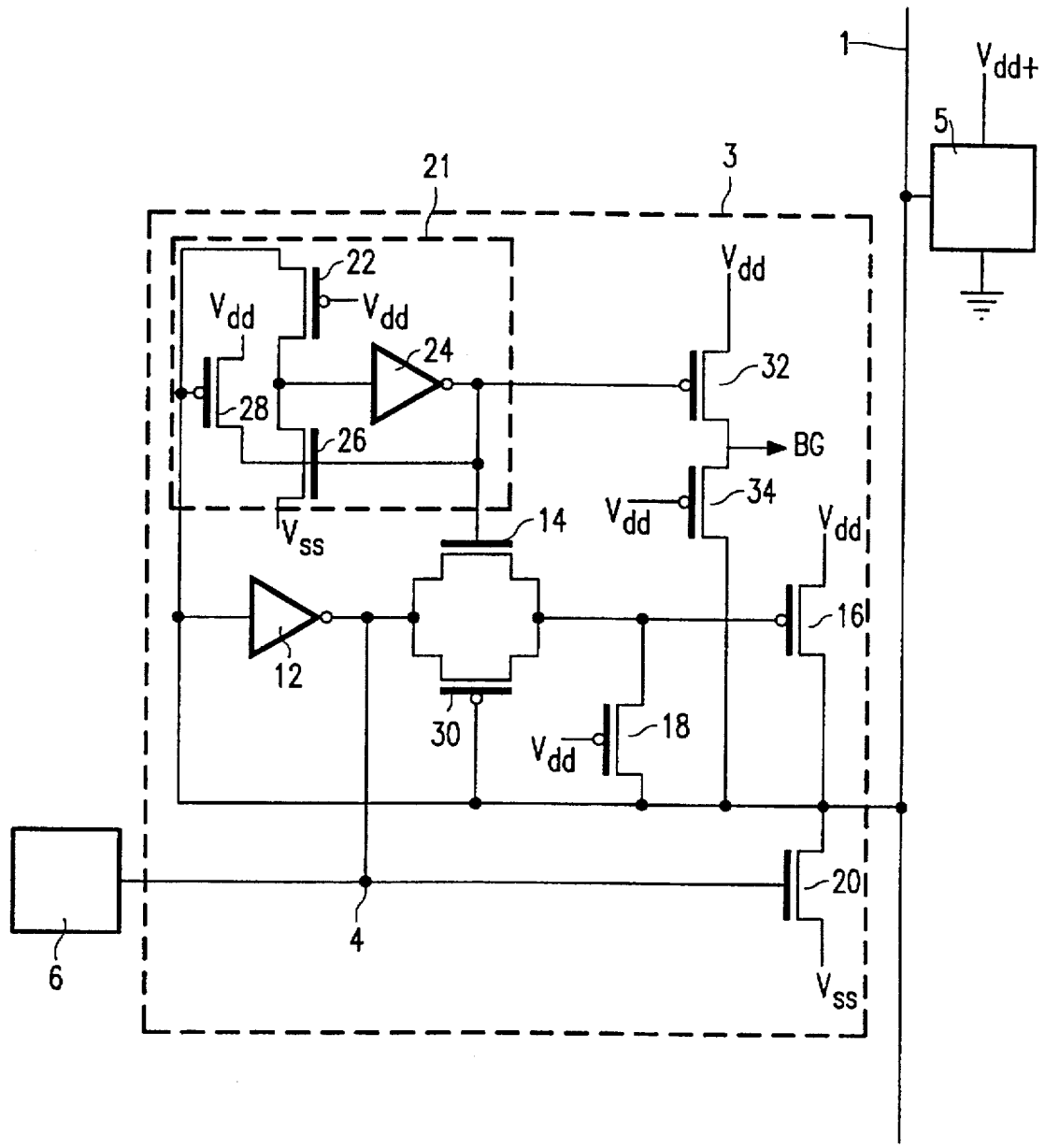

5,764,468

CIRCUIT COMPRISING A BUS CONDUCTOR AND A BUS INTERFACE CIRCUIT

BACKGROUND OF THE INVENTION

The invention relates to a circuit comprising a bus conductor and an interface stage connected to the bus conductor, the circuit in an overvoltage state being capable of pulling the bus conductor to a bus potential outside a power supply range of the interface stage, the interface stage comprising an output transistor having a main current channel coupled between the bus conductor and a power supply terminal for a pole of the power supply range;

adaptation means for adapting a control potential on a control electrode so that the output transistor not turned on when the circuit is in the overvoltage state;

a control circuit;

a switching element, an output of the control circuit being coupled to the control electrode of the output transistor via the switching element. The invention also relates to a bus interface circuit for use in such a circuit. A circuit of this kind is known from PCT Patent Application WO 94/29961.

Nowadays circuit components are available which are powered by a potential of 5 V and also those which are powered by 3.3 V. Generally speaking, circuit components with increasingly lower supply potentials will be used.

It is desirable that these different types of circuit components can be combined in one circuit. The circuit components with different power supplies in such a circuit must all be capable of driving the bus potential with an own interface stage. As a result, the bus potential could be pulled outside the power supply range of some of the circuit components. In a circuit in which differently powered circuit components communicate via a bus conductor, therefore, special steps need be taken in the interface stage.

SUMMARY OF THE INVENTION

An interface stage comprises an output transistor, for example a PMOS transistor, which comprises a main current channel which connects the bus conductor to the power supply terminal of the associated circuit component, for example for a 3.3 V power supply. The interface stage also comprises a control circuit which controls the control electrode of the output transistor. When the interface stage is enabled, the control circuit can drive the control electrode in such a manner that the main current channel becomes conductive. The bus potential then reaches the level of the power supply potential, for example 3.3 V. When the interface stage is disabled, a circuit component with a higher supply potential can pull up the bus potential, so that the bus potential becomes, for example 5 V. An overvoltage state then occurs in relation to the interface stage powered by 3.3 V.

In the overvoltage state the output transistor in the interface stage, having a lower power supply potential of, for example 3.3 V, could be turned on. The circuit known from WO 94/29961 prevents turning on in that in the overvoltage state it pulls the control potential along with the bus potential. Furthermore, the switching element is situated between the control electrode of the output transistor and the output of the control circuit. The switching element is turned off when the interface stage is disabled. Consequently, the higher control potential cannot reach the output of the control circuit.

The switching element disclosed in WO 94/29961 comprises an NMOS junction transistor whose main current channel is connected between the output of the control circuit and the control electrode of the output transistor. The switching element also comprises an inverter. The output of the control circuit controls the gate of the NMOS junction transistor via the inverter. Consequently, this transistor is turned off when the output of the control circuit is logic high; this is always the case in the disabled state.

If the interface stage is in an enabled state while another circuit component pulls up the bus potential to a higher power supply potential, however, the higher power supply potential can reach the output of the control circuit. In interface stages of normal circuit components this is never the case because, normally speaking, always only one circuit component at a time is enabled. However, it is the case, for example if the interface stage forms part of a bus-hold circuit. Such a bus-hold circuit comprises inverting circuits in an antiparallel connection. The logic state of the bus conductor is thus taken over and retained even if the bus conductor is not actively controlled further.

It is problematic that in this type of circuit the higher power supply potential can reach the output of the control circuit.

It is inter alia an object of the invention to provide a circuit which comprises an interface stage coupled to a bus conductor and in which the interface stage can be actively driven without adverse effects when the overvoltage state occurs.

It is a further object of the invention to provide a bus-hold circuit coupled to a bus conductor on which the overvoltage state can occur.

The circuit in accordance with the invention is characterized in that the interface stage comprises detection means for detecting the overvoltage state in dependence on the bus potential, the detection means being coupled to a control input of the switching element in order to turn off the switching element in response to said detection. Because the switching element is turned off in dependence on the bus potential, it is ensured that the potential on the output of the control circuit cannot leave the power supply potential range of the interface stage and, the control circuit, out of the overvoltage state, always remains capable of controlling the control electrode of the output transistor.

An embodiment of the circuit in accordance with the invention is characterized in that the control circuit is coupled, by way of an input, to the bus conductor and has a logic inverting transfer function between its input and output. In conjunction with the output transistor the control circuit thus constitutes a latch which serves as a bus-hold circuit and which can remain active while other circuit components control the bus potential.

An embodiment of the circuit in accordance with the invention is characterized in that the detection means comprise a detection transistor of the same polarity as the output transistor, a control electrode of the detection transistor being coupled to the power supply terminal and a main current channel of the detection transistor being coupled, at least in the overvoltage state, between the bus conductor and the control input of the switching element. Thus, the detection does not require a power supply potential higher than that of the interface stage.

An embodiment of the circuit in accordance with the invention is characterized in that the switching element comprises a junction transistor whose polarity is complementary to that of the output transistor, its main current channel being coupled between the output of the control circuit and the control electrode of the output transistor, and the detection transistor being coupled to a control electrode of the junction transistor via an inverting circuit.

An embodiment of the circuit in accordance with the invention is characterized in that the interface stage comprises a detection load transistor having a main current channel coupled between a further power supply terminal and an input of the inverting circuit, a control electrode of the detection load transistor being coupled to an output of the inverting circuit. The detection load transistor is thus turned off when the detection transistor is turned on. The power consumption of the circuit is thus reduced.

An embodiment of the circuit in accordance with the invention is characterized in that the switching element comprises a further junction transistor whose polarity is the same as that of the output transistor, a main current channel being connected parallel to that of the junction transistor and a control electrode being coupled to the bus conductor. The further junction transistor enhances the operation of the circuit when the control potential on the control electrode of the output transistor is pulled to logic low in the normal state. The further junction transistor is simply controlled by means of the bus potential.

An embodiment of the circuit in accordance with the invention is characterized in that the interface stage comprises a backgate bias circuit having an output coupled to a backgate of the output transistor, which backgate bias circuit comprises a first bias transistor having a main current channel coupled between the bus conductor and the output of the backgate bias circuit and a control electrode coupled to the power terminal. The backgate bias of the output transistor is thus adapted in the overvoltage state.

An embodiment of the circuit in accordance with the invention is characterized in that the backgate bias circuit comprises a second bias transistor having a main current channel coupled between the power supply terminal and the output of the backgate bias circuit and a control electrode coupled to a node between the main current channel of the detection transistor and the control input of the switching element. The backgate bias is thus maintained at the power supply potential in the normal state and is decoupled therefrom in the overvoltage state, without an additional detection circuit being required.

An embodiment of the circuit in accordance with the invention is characterized in that the output of the control circuit is coupled to an input of a logic processing circuit. The circuit thus controls the logic processing circuit by means of a potential from within the power supply range both in the normal state and in the overvoltage state.

BRIEF DESCRIPTION OF THE DRAWINGS

These and other attractive aspects of the invention will be described in detail hereinafter, by way of a non-limitative example, with reference to a Figure.

The Figure shows a circuit in accordance with the invention. The circuit comprises a bus conductor 1, a bus-hold circuit 3 and a further circuit component 5. The bus-hold circuit 3 and the further circuit component 5 are connected to the bus conductor 1. The input of a logic processing circuit 6 is coupled to an output 4 of the bus-hold circuit 3. The logic processing circuit is, for example a buffer amplifier for driving another bus conductor (not shown) or a combinatory logic circuit.

DESCRIPTION OF THE PREFERRED EMBODIMENTS

The bus conductor 1 is coupled to an input of a first inverter 12 in the bus-hold circuit 3. An output of the first inverter 12 is coupled to the gate of a PMOS output transistor 16 via the channel of an NMOS junction transistor 14. The channel of the PMOS output transistor 16 connects the power supply terminal Vdd of the bus-hold circuit 3 to the bus conductor 1. The gate of the PMOS output transistor 16 is coupled to the bus conductor 1 via the channel of a PMOS matching transistor 18. The gate of the matching transistor 18 is coupled to the power supply terminal Vdd. The bus conductor 1 is connected to a further power supply terminal Vss via the channel of an NMOS output transistor 20. The gate of the NMOS output transistor 20 is coupled to the output of the first inverter 12. The channel of a PMOS junction transistor 30 is connected parallel to the channel of the NMOS junction transistor 14. The gate of the PMOS junction transistor 30 is coupled to the bus conductor 1.

The bus-hold circuit 3 also comprises an overvoltage detection circuit 21 for the gate of the NMOS 14. The overvoltage detection circuit 21 has an input coupled to the bus conductor 1. This input is coupled, via the channel of a PMOS detection transistor 22, to the input of a second inverter 24. The gate of the PMOS detection transistor 22 is coupled to the power supply terminal Vdd. The output of the second inverter 24 is coupled to the gate of the NMOS junction transistor 14.

The overvoltage detection circuit 21 also comprises an NMOS load transistor 26 whose channel is coupled between the input of the second inverter 24 and the further power supply terminal Vss. The output of the second inverter 24 is coupled to the gate of the NMOS load transistor 26. A PMOS pull-up transistor 28 has its channel coupled between the gate of the NMOS load transistor 26 and the power supply terminal Vdd. The gate of the PMOS pull-up transistor 28 is coupled to the bus conductor 1.

The bus-hold circuit 3 also comprises a backbias generation circuit 32, 34. The backbias generation circuit 32, 34 comprises a backbias output BG which is coupled to the backgates of the PMOS transistors 16, 18, 22, 30, 32, 34 of the bus-hold circuit 3 whose channel can come into conductive contact with the bus conductor 1. The backbias circuit 32, 34 comprises a PMOS transistor 32 whose channel is coupled between the power supply terminal Vdd and the backbias output BG. The gate of the PMOS transistor 32 is coupled to the output of the second inverter 24. The backbias circuit 32, 34 also comprises a PMOS transistor 34 whose channel is coupled between the bus conductor 1 and the backbias output BG. The gate of the PMOS transistor 32 is coupled to the first power supply terminal.

The operation of the bus-hold circuit 3 is dependent on the bus potential on the bus conductor 1. In a normal state the bus potential is between the potentials of the power supply terminal Vdd (for example, 3.3 V) and the further power supply terminal Vss (for example, 0 V). In an overvoltage state the bus potential is higher than the potential of the power supply terminal Vdd. The overvoltage state may occur, for example if the circuit component 5 is powered by a higher potential Vdd+ (for example, 5 V) and the circuit component 5 controls the bus potential.

The bus-hold circuit serves to drive the input of the logic processing circuit 6. The logic processing circuit 6 receives an input signal from the inverter 12, which input signal is between the power supply potentials of the bus-hold circuit 3 in the normal state. This input signal is logic low in the overvoltage state.

In the normal state the bus-hold circuit 3 acts as a latch. The PMOS output transistor 16 and the NMOS output transistor 20 together constitute an inverter in an antiparallel connection with the first inverter 12 (which means that its output and input are connected to the input and output, respectively, of the first inverter 12). Consequently, the logic processing circuit 6 receives an input signal which is held by the bus-hold circuit 3 even if the bus conductor 1 is no longer controlled by another circuit component. The bus potential is also held by the bus-hold circuit 3. The driving power of the bus-hold circuit 3 is then so small that other circuit components can switch over the bus potential, despite the holding by the bus-hold circuit 3. The bus-hold circuit 3 can also be used for holding the bus potential in the absence of a logic processing circuit 6.

In the overvoltage state the control potential on the gate of the PMOS output transistor 16 is pulled along with the bus potential. On the basis of the bus potential the overvoltage detection circuit 21 detects the occurrence of the overvoltage state and, consequently, blocks the junction transistor 14.

The PMOS matching transistor 18 serves to pull along the control potential on the gate of the output transistor 16 with the bus potential in the overvoltage state. The channel of the PMOS matching transistor 18 is conductive if the bus potential exceeds the power supply potential Vdd by more than a threshold voltage, and hence pulls along the control potential.

The PMOS detection transistor 22 serves to activate the overvoltage detection circuit 21 in the overvoltage state. The channel of the PMOS detection transistor 22 is also conductive if the bus potential exceeds the power supply potential Vdd by more than a threshold voltage. Consequently, the PMOS detection transistor 22 pulls up the potential on the input of the second inverter 24 in the overvoltage state. The second inverter 24 then makes the potential on its output, and hence also that on the gate of the NMOS junction transistor 14, logic low. It is thus ensured that the NMOS junction transistor 14 is turned off, irrespective of the logic level of the output of the first inverter 12 (being between the potentials Vdd and Vss). The same effect is achieved if the PMOS detection transistor 22 is connected to the control electrode of the PMOS output transistor 16 instead of to the bus conductor 1.

Thus, the overvoltage detection circuit 21 does not require a power supply potential higher than the potential Vdd on the power supply terminal of the interface stage. Consequently, it is not necessary either to use a power supply potential of the level of the power supply potential of the circuit component 5 controlling the bus potential in the overvoltage state.

The PMOS junction transistor 30 is turned off if the bus potential is high, so also in the overvoltage state. The circuit can in principle operate also without the PMOS junction transistor 30, but in the normal state the PMOS junction transistor 30 assists in pulling up the gate of the output transistor 16.

The NMOS load transistor 26 is turned on in the normal state so that it keeps the input of the second inverter 24 low. In the overvoltage state the NMOS load transistor 26 is turned off by the second inverter 24, so that it does not constitute a load to the bus conductor 1. For a smooth transition from the normal state to the overvoltage state it is desirable that the PMOS detection transistor 22 is much larger (larger W/L ratio) than the NMOS load transistor 26. In the overvoltage state the PMOS detection transistor 22 will then always dominate in controlling the potential on the input of the second inverter 24.

The PMOS pull-up transistor 28 ensures that the NMOS load transistor 26 is turned on upon transition from the overvoltage state to a logic low bus potential in the normal state. As a result, the NMOS load transistor 26 pulls down the input of the second inverter 24 in that case.

The backbias generation circuit 32, 34 ensures that the backbias potential of the PMOS transistors whose channel can be conductively connected to the bus conductor 1 is always the higher one of the power supply potential and the bus potential. In the normal state the PMOS transistor 32 whose channel is situated between the power supply terminal Vdd and the backbias output BG is turned on. This channel is turned off in the overvoltage state by the overvoltage detection circuit 21 which detects the overvoltage state. In the overvoltage state the PMOS transistor 34 whose channel is situated between the bus conductor 1 and the backbias output BG is turned on when the bus potential exceeds the potential of the power supply terminal Vdd by more than a threshold voltage; this channel is turned off in the normal state.

We claim:

1. A circuit comprising a bus conductor and an interface stage connected to the bus conductor, the circuit in an overvoltage state being capable of pulling the bus conductor to a bus potential outside a power supply range of the interface stage, the interface stage comprising:

a power supply terminal for a pole of the power supply range an output transistor having a control electrode, and a main current channel coupled between the bus conductor and the power supply terminal;

a control circuit having an output;

a switching element having a control input and coupling the output of the control circuit to the control electrode of the output transistor, and detection means for detecting the overvoltage state in dependence on the bus potential, the detection means being coupled to the control input of the switching element to turn off the switching element in response to detection of said overvoltage state, irregardless of the state of said control circuit.

2. A circuit as claimed in claim 1, characterized in that the control circuit is coupled, by way of an input, to the bus conductor and has a logic inverting transfer function between its input and output.

3. A circuit as claimed in claim 1, characterized in that the detection means comprise a detection transistor of the same polarity as the output transistor, the detection transistor has a control electrode coupled to the power supply terminal, and the detection transistor has a main current channel coupled, at least in the overvoltage state, between the bus conductor and the control input of the switching element.

4. A circuit as claimed in claim 3, characterized in that the switching element comprises a junction transistor having a polarity complementary to that of the output transistor, a control electrode and main current channel coupled between the output of the control circuit and the control electrode of the output transistor, the circuit further including an inverting circuit coupling the detection transistor to the control electrode of the junction transistor.

5. A circuit as claimed in claim 4, characterized in that the interface stage comprises a detection load transistor having a main current channel coupled between a further power supply terminal and an input of the inverting circuit, a control electrode of the detection load transistor being coupled to an output of the inverting circuit.

6. A circuit as claimed in claim 5, characterized in that the switching element comprises a further junction transistor whose polarity is the same as that of the output transistor, a main current channel being connected parallel to that of the junction transistor and a control electrode being coupled to the bus conductor.

7. A circuit as claimed in claim 1, characterized in that the interface storage comprises a backgate bias circuit having an output coupled to a backgate of the output transistor, which backgate bias circuit comprises a first bias transistor having a main current channel coupled between the bus conductor and the output of the backgate bias circuit and a control electrode coupled to the power supply terminal.

8. A circuit as claimed in claim 7, in which the backgate bias circuit comprises a second bias transistor having a main current channel coupled between the power supply terminal and the output of the backgate bias circuit and a control electrode coupled to a node between the main current channel of the detection transistor and the control input of the switching element.

9. A circuit as claimed in claim 1, in which the output of the control circuit is coupled to an input of a logic processing circuit.

10. A bus interface circuit for connection to a bus conductor, said bus interface circuit comprising:

a power supply terminal for a pole of the power supply range an output transistor having a main current channel coupled between the bus conductor and the power supply terminal;

a control circuit having an output;

a switching element coupling the output of the control circuit to the control electrode of the output transistor via the switching element, and detection means for detecting the overvoltage state in dependence on the bus potential, the detection means being coupled to a control input of the switching element to turn off the switching element, thereby turning off said output transistor, in response to said detection of said overvoltage state, irregardless of the state of said control circuit.

11. A bus interface circuit for coupling to a bus conductor, comprising:

a power supply terminal for receiving a power supply voltage;

an output transistor having a main current path coupled between the power supply terminal and the bus conductor;

a control circuit having an input coupled to the bus conductor and an output;

a junction transistor having a polarity complementary to that of the output transistor, a control electrode, and a main current channel coupled between the output of the control circuit and the control electrode of the output transistor;

detection means for detecting the overvoltage state in dependence on the bus potential, the detection means comprising a detection transistor of the same polarity as said output transistor, said detection transistor having a control electrode coupled to said power supply terminal and a main current channel coupled, at least in the overvoltage state, between the bus conductor and the control electrode of the junction transistor to turn off the switching element in response to said detection of the overvoltage state; and an inverting circuit coupling the control electrode of said junction transistor to the detection transistor.

* * * * *